(12) United States Patent
Guth et al.

(10) Patent No.: US 7,682,875 B2
(45) Date of Patent: Mar. 23, 2010

(54) METHOD FOR FABRICATING A MODULE INCLUDING A SINTERED JOINT

(75) Inventors: Karsten Guth, Soest (DE); Ivan Nikitin, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/128,224

(22) Filed: May 28, 2008

(65) Prior Publication Data
US 2009/0294963 A1    Dec. 3, 2009

(51) Int. Cl.
*H01L 21/603* (2006.01)
(52) U.S. Cl. .................. 438/119; 438/615; 257/E21.51; 977/777
(58) Field of Classification Search .................. 438/615
See application file for complete search history.

(56) References Cited
FOREIGN PATENT DOCUMENTS

| CN | 200610014157.5 | 8/2006 |
|---|---|---|
| EP | 0 242 626 | 3/1987 |
| EP | 0 330 895 | 2/1989 |
| JP | 2006202586 | 8/2006 |
| JP | 2006202944 | 8/2006 |
| JP | 2006352080 | 12/2006 |
| WO | 2005/079353 | 9/2005 |
| WO | WO 2005/079353 A2 * | 9/2005 |

* cited by examiner

*Primary Examiner*—Stephen W Smoot
(74) *Attorney, Agent, or Firm*—Dicke, Billig & Czaja, PLLC

(57) ABSTRACT

A method comprises applying a paste comprising metal grains, a solvent, and a sintering inhibitor to one of a die and a metal layer. The method comprises evaporating the solvent in the paste and placing the one of the die and the metal layer on the other of the die and the metal layer such that the paste contacts the die and the metal layer. The method comprises applying a force to the one of the die and the metal layer and decomposing the sintering inhibitors to form a sintered joint joining the die to the metal layer.

19 Claims, 3 Drawing Sheets

METHOD FOR FABRICATING A MODULE INCLUDING A SINTERED JOINT

BACKGROUND

Power electronic modules are semiconductor packages that are used in power electronic circuits. Power electronic modules are typically used in vehicular and industrial applications, such as in inverters and rectifiers. The semiconductor components included within the power electronic modules are typically insulated gate bipolar transistor (IGBT) semiconductor chips or metal-oxide-semiconductor field effect transistor (MOSFET) semiconductor chips. The IGBT and MOSFET semiconductor chips have varying voltage and current ratings. Some power electronic modules also include additional semiconductor diodes (i.e., free-wheeling diodes) in the semiconductor package for overvoltage protection.

In general, two different power electronic module designs are used. One design is for higher power applications and the other design is for lower power applications. For higher power applications, a power electronic module typically includes several semiconductor chips integrated on a single substrate. The substrate typically includes an insulating ceramic substrate, such as $Al_2O_3$, AlN, $Si_3N_4$, or other suitable material, to insulate the power electronic module. At least the top side of the ceramic substrate is metallized with either pure or plated Cu, Al, or other suitable material to provide electrical and mechanical contacts for the semiconductor chips. The metal layer is typically bonded to the ceramic substrate using a direct copper bonding (DCB) process, a direct aluminum bonding process (DAB) process, or an active metal brazing (AMB) process.

Typically, soft soldering with Sn—Pb, Sn—Ag, Sn—Ag—Cu, or another suitable solder alloy is used for joining a semiconductor chip to a metallized ceramic substrate. Typically, several substrates are combined onto a metal baseplate. In this case, the backside of the ceramic substrate is also metallized with either pure or plated Cu, Al, or other suitable material for joining the substrates to the metal baseplate. To join the substrates to the metal baseplate, soft soldering with Sn—Pb, Sn—Ag, Sn—Ag—Cu, or another suitable solder alloy is typically used.

For lower power applications, instead of ceramic substrates, leadframe substrates (e.g., pure Cu substrates) are typically used. Depending upon the application, the leadframe substrates are typically plated with Ni, Ag, Au, and/or Pd. Typically, soft soldering with Sn—Pb, Sn—Ag, Sn—Ag—Cu, or another suitable solder alloy is used for joining a semiconductor chip to a leadframe substrate.

For high temperature applications, the low melting point of the solder joints ($T_m$=180° C.-220° C.) becomes a critical parameter for power electronic modules. During operation of power electronic modules, the areas underneath the semiconductor chips are exposed to high temperatures. In these areas, the ambient air temperature is superposed by the heat that is dissipated inside the semiconductor chip. This leads to a thermal cycling during operation of the power electronic modules. Typically, with respect to thermal cycling reliability, a reliable function of a solder joint cannot be guaranteed above 150° C. Above 150° C., cracks may form inside the solder region after a few thermal cycles. The cracks can easily spread over the entire solder region and lead to the failure of the power electronic module.

With the increasing desire to use power electronics in harsh environments (e.g., automotive applications) and the ongoing integration of semiconductor chips, the externally and internally dissipated heat continues to increase. Therefore, there is a growing demand for high temperature power electronic modules capable of operating with internal and external temperatures up to and exceeding 200° C. In addition, to lower the cost of high temperature power electronic modules, noble metal surfaces for joining semiconductor chips to substrates and noble metal surfaces for joining substrates to metal baseplates should be avoided.

For these and other reasons, there is a need for the present invention.

SUMMARY

One embodiment provides a method for fabricating a module. The method comprises applying a paste comprising metal grains, a solvent, and a sintering inhibitor to one of a die and a metal layer. The method comprises evaporating the solvent in the paste and placing the one of the die and the metal layer on the other of the die and the metal layer such that the paste contacts the die and the metal layer. The method comprises applying a force to the one of the die and the metal layer and decomposing the sintering inhibitors to form a sintered joint joining the die to the metal layer.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
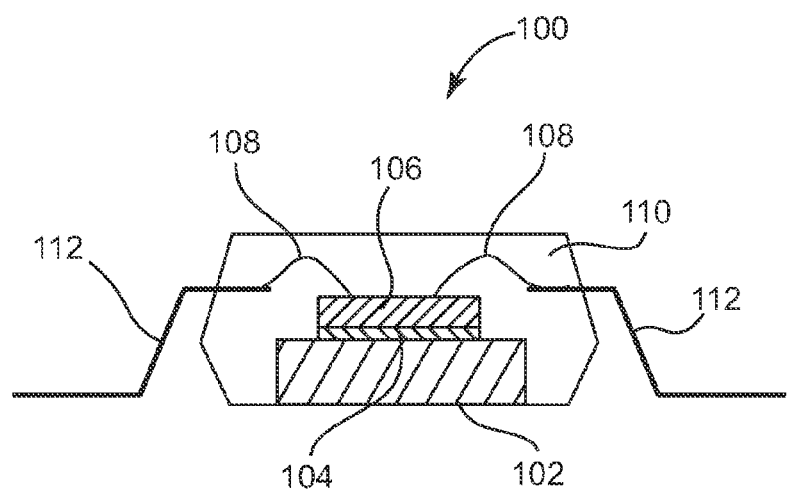
FIG. 1 illustrates a cross-sectional view of one embodiment of a module.

FIG. 1 illustrates a cross-sectional view of one embodiment of a module 100. In one embodiment, module 100 is a high temperature (i.e., up to and exceeding 200° C.) low power electronic module. Power electronic module 100 includes a leadframe substrate 102, a sintered joint 104, a semiconductor chip or die 106, bond wires 108, leads 112, and a housing 110. Leadframe substrate 102 includes Cu, Al, or another suitable material. In one embodiment, leadframe substrate 102 is plated with Ni, Ag, Au, and/or Pd. In one embodiment, sintered joint 104 joins leadframe substrate 102 directly to semiconductor chip 106 without using a noble metal layer between leadframe substrate 102 and semiconductor chip 106. By not using a noble metal layer, the cost of power electronic module 100 is reduced compared to typical high temperature power electronic modules.

As used herein, the term "electrically coupled" is not meant to mean that the elements must be directly coupled together and intervening elements may be provided between the "electrically coupled" elements.

Semiconductor chip 106 is electrically coupled to leads 112 through bond wires 108. Bond wires 108 include Al, Cu, Al—Mg, Au, or another suitable material. In one embodiment, bond wires 108 are bonded to semiconductor chip 106 and leads 112 using ultrasonic wire bonding. In one embodiment, leadframe substrate 102 has a thickness within the range of 125 μm to 200 μm. Leadframe substrate 102 is joined to semiconductor chip 106 using a low temperature joining (LTJ) process to provide sintered joint 104. Sintered joint 104 is formed without oxidizing the surface of leadframe substrate 102. Housing 110 includes a mould material or another suitable material. Housing 110 surrounds leadframe substrate 102, sintered joint 104, semiconductor chip 106, bond wires 108, and portions of leads 112.

Figure 2:
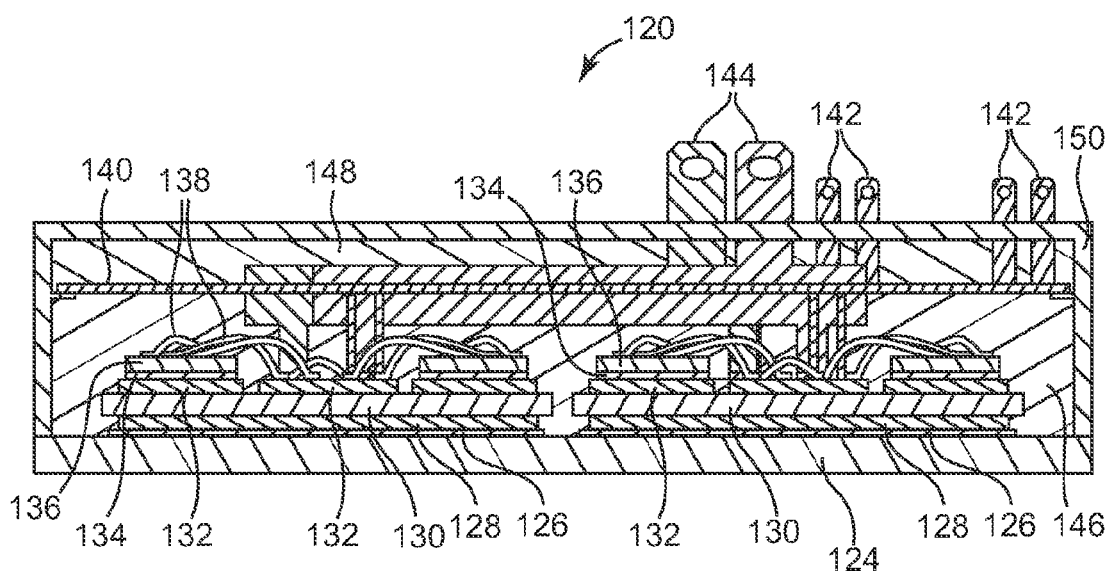
FIG. 2 illustrates a cross-sectional view of another embodiment of a module.

FIG. 2 illustrates a cross-sectional view of another embodiment of a module 120. In one embodiment, module 120 is a high temperature (i.e., up to and exceeding 200° C.) high power electronic module. Power electronic module 120 includes a metal baseplate 124, sintered joints 126, metalized ceramic substrates 130 including metal surfaces or layers 128 and 132, sintered joints 134, semiconductor chips 136, bond wires 138, circuit board 140, control contacts 142, power contacts 144, potting 146 and 148, and housing 150.

Ceramic substrates 130 include $Al_2O_3$, AlN, $Si_3N_4$, or other suitable material. In one embodiment, ceramic substrates 130 each have a thickness within a range of 0.2 mm to 2.0 mm. Metal layers 128 and 132 include Cu, Al, or another suitable material. In one embodiment, metal layers 128 and/or 132 are plated with Ni, Ag, Au, and/or Pd. In one embodiment, metal layers 128 and 132 each have a thickness within a range of 0.1 mm to 0.6 mm. In one embodiment, sintered joints 126 join metal layers 128 directly to metal baseplate 124 without using a noble metal layer between metal layers 128 and metal baseplate 124. In one embodiment, sintered joints 134 join metal layers 132 directly to semiconductor chips 136 without using a noble metal layer between metal layers 132 and semiconductor chips 136. By not using noble metal layers, the cost of power electronic module 120 is reduced compared to typical high temperature power electronic modules.

Semiconductor chips 136 are electrically coupled to metal layers 132 through bond wires 138. Bond wires 138 include Al, Cu, Al—Mg, Au, or another suitable material. In one embodiment, bond wires 138 are bonded to semiconductor chips 136 and metal layers 132 using ultrasonic wire bonding. Metal layers 132 are electrically coupled to circuit board 140 and power contacts 144. Circuit board 140 is electrically coupled to control contacts 142.

Housing 150 encloses sintered joints 126, metallized ceramic substrates 130 including metal layers 128 and 132, sintered joints 134, semiconductor chips 136, bond wires 138, circuit board 140, portions of control contacts 142, and portions of power contacts 144. Housing 150 includes technical plastics or another suitable material. Housing 150 is joined to metal baseplate 124. In one embodiment, a single metallized ceramic substrate 130 is used such that metal baseplate 124 is excluded and housing 150 is joined directly to the single metallized ceramic substrate 130.

Potting material 146 fills areas below circuit board 140 within housing 150 around sintered joints 126, metallized ceramic substrates 130 including metal layers 128 and 132, sintered joints 134, semiconductor chips 136, and bond wires 138. Potting material 148 fills the area above circuit board 150 within housing 150 around portions of control contacts 142 and portions of power contacts 144. Potting material 146 and 148 includes silicone gel or another suitable material. Potting material 146 and 148 prevents damage to power electronic module 120 by dielectrical breakdown.

The following FIGS. 3-6 illustrate embodiments for low temperature joining of a semiconductor chip to a substrate including a metal surface, such as joining semiconductor chip 106 to leadframe substrate 102 as previously described and illustrated with reference to FIG. 1 or joining a semiconductor chip 136 to a metal layer 132 as previously described and illustrated with reference to FIG. 2. A similar process can also be used for low temperature joining of a metallized substrate to a metal baseplate, such as joining a metal layer 128 to metal baseplate 124 as previously described and illustrated with reference to FIG. 2.

Figure 3:
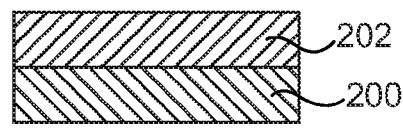
FIG. 3 illustrates a cross-sectional view of one embodiment of a semiconductor chip and a metal paste.

FIG. 3 illustrates a cross-sectional view of one embodiment of a semiconductor chip 200 and a metal paste 202. Metal paste 202 is applied to the backside of semiconductor chip 200. In another embodiment, metal paste 202 is applied to a wafer before die separation. Metal paste 202 is applied to semiconductor chip 200 by printing, dispensing, or other suitable method. Metal paste 202 includes metal grains having a grain size in the nanometer range. The metal grains include one or more of Au, Ag, Cu, or other suitable metals. In one embodiment, metal paste 202 includes metal grains having a grain size distribution where at least 50% of the grains are smaller than 50 nm. In another embodiment, metal paste 202 includes metal grains having a grain size distribution where at least 95% of the grains are smaller than 50 nm.

Metal paste 202 also includes one or more solvents to control the viscosity of the metal paste and a sintering inhibitor to prevent the metal grains from sintering at low temperatures. The solvents of metal paste 202 are selected to decompose at a temperature ($T_{solvent}$) within the range of 25° C. to 200° C. The solvents of metal paste 202 are also selected such that the solvents dry out in response to temperature and/or a vacuum without degrading the sintering inhibitor. In one embodiment, the sintering inhibitor includes a technical wax or another suitable material. The sintering inhibitor of metal paste 202 is selected to decompose at a temperature ($T_{inhibitor}$) within the range of 150° C. to 400° C. The sintering inhibitor is selected to decompose at a higher temperature than the solvents. By maximizing the temperature difference between $T_{solvent}$ and $T_{inhibitor}$, the process window is maximized.

Figure 4:
FIG. 4 illustrates a cross-sectional view of one embodiment of the semiconductor chip and the metal paste after drying the metal paste.

FIG. 4 illustrates a cross-sectional view of one embodiment of semiconductor chip 200 and metal paste 204 after drying metal paste 202. Metal paste 202 is dried at a temperature within the range of 25° C. to 200° C. and/or by a vacuum to provide dried metal paste 204. The temperature and/or vacuum are selected based on the solvents used to ensure an evaporation of the solvents. The temperature is selected such that a sintering of the metal grains during the evaporation of the solvents is prevented by the sintering inhibitor.

Figure 5:
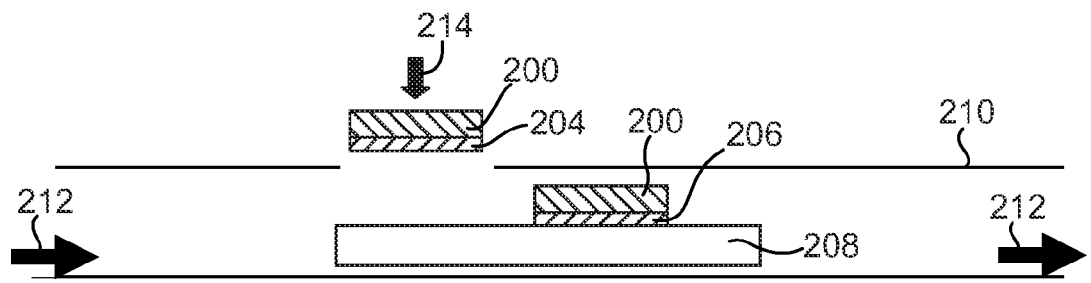
FIG. 5 illustrates a cross-sectional view of one embodiment of placing the semiconductor chip on a substrate.

FIG. 5 illustrates a cross-sectional view of one embodiment of placing semiconductor chip 200 on a substrate 208. A substrate 208 is placed into an indexing tunnel furnace 210 in the direction indicated at 212. Substrate 208 includes Au, Ag, Cu, or another suitable material. The atmosphere within tunnel furnace 210 is non-oxidizing. In one embodiment, the non-oxidizing atmosphere includes $N_2$, $N_2$—$H_2$ (i.e., forming gas), $H_2$, HCOOH, or another suitable gas. The non-oxidizing atmosphere enables substrate 208 to include non-noble metal surfaces. Tunnel furnace 210 heats substrate 208 to a temperature within the range of 150° C. to 450° C. Semiconductor chip 200 with metal paste 204 is placed on substrate 208 as indicated at 214 using a pick-and-place-like method.

Figure 6:
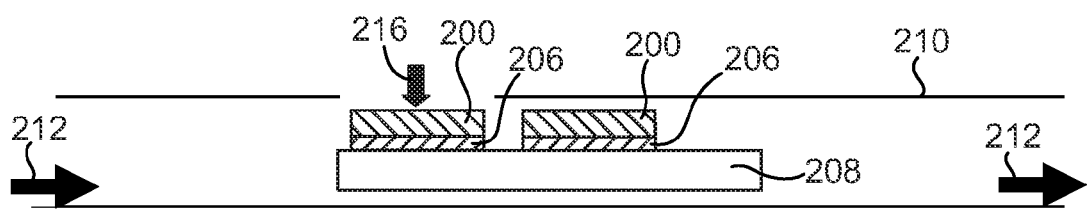
FIG. 6 illustrates a cross-sectional view of one embodiment of bonding the semiconductor chip to the substrate.

FIG. 6 illustrates a cross-sectional view of one embodiment of bonding semiconductor chip 200 to substrate 208. A bond force as indicated at 216 is applied to semiconductor chip 200 to bond semiconductor chip 200 to heated substrate 208. In one embodiment, the bond force is within the range of 1 MPa to 40 MPa. In another embodiment, the bond force is within the range of 1 MPa to 10 MPa. The bond force is applied for a time within the range of 50 ms to 6000 ms. The bond force provides a good coalescence of the metal grains to substrate 208 and semiconductor chip 200. Heated substrate 208 quickly decomposes the sintering inhibitor to form a sintered joint 206 bonding semiconductor chip 200 to substrate 208.

Figure 7:
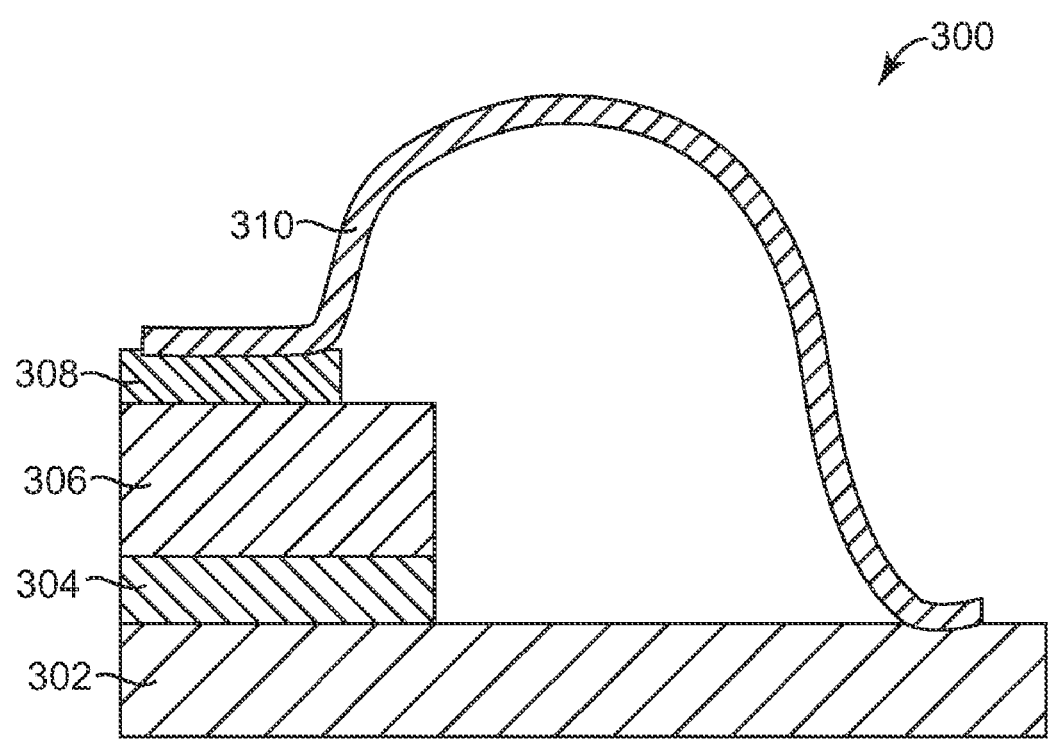
FIG. 7 illustrates a cross-sectional view of another embodiment of a module.

FIG. 7 illustrates a cross-sectional view of another embodiment of a module 300. Module 300 includes a substrate 302, a sintered joint 304, a semiconductor chip or die 306, a sintered joint 308, and a metal ribbon 310. In one embodiment, sintered joint 304 joins substrate 302 directly to semiconductor chip 306 without using a noble metal layer between substrate 302 and semiconductor chip 306. In addition, sintered joint 308 joins semiconductor chip 306 to metal ribbon 310 without using a noble metal layer between semiconductor chip 306 and metal ribbon 310. Sintered joint 308 provides a front-side connection to semiconductor chip 306. In other embodiments, metal ribbon 310 is replaced with a metal plate and sintered joint 308 joins the metal plate to semiconductor chip 306.

In one embodiment, semiconductor chip 306 is joined to substrate 302 using a low temperature joining process to provide sintered joint 304 as previously described and illustrated with reference to FIGS. 3-6. Metal ribbon 310 is also joined to semiconductor chip 306 using a low temperature joining process to provide sintered joint 308. In one embodiment, a similar process as described with reference to FIGS. 3-6 is used to join metal ribbon 310 to semiconductor chip 306, except that in this case the metal paste is applied to the metal ribbon and the bond force is also applied to the metal ribbon.

Embodiments provide low temperature joining of substrates, metal ribbons, and/or metal plates including non-noble metal layers to semiconductor chips, metal baseplates, and/or other suitable components. Embodiments provide a continuous mass production process for forming low temperature sintered joints using a nano-metal paste. The sintered joints are formed at high speed using a pick-and-place-like method. The surface of the metal layer to be joined is protected from oxidation during sintering without using noble metal layers. In this way, the joined components are produced at lower cost than typical low temperature joined components and are suitable for high temperature applications up to and exceeding 200° C.

While the illustrated embodiments substantially focused on power electronic modules, the embodiments are applicable to any circuit where low temperature joining of components to a substrate is desired.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for fabricating a module, the method comprising:
    applying a paste comprising metal grains, a solvent, and a sintering inhibitor to a die;
    evaporating the solvent in the paste;
    heating a substrate comprising a metal layer in a non-oxidizing atmosphere;
    placing the die on the heated metal layer such that the paste contacts the heated metal layer; and
    applying a force to one of the die and the metal layer to form a sintered joint joining the die to the metal layer.

2. The method of claim 1, wherein heating the substrate comprises heating the substrate at a temperature within a range of 150° C. to 400° C.

3. The method of claim 1, wherein heating the substrate comprises heating a substrate comprising a non-noble metal layer.

4. The method of claim 1, wherein applying the force comprises applying a force within a range of 1 MPa to 10 MPa.

5. The method of claim 1, wherein applying the force comprises applying the force for a time within a range of 50 ms to 6000 ms.

6. The method of claim 1, wherein evaporating the solvent comprises placing the die with the paste in a vacuum.

7. The method of claim 1, wherein evaporating the solvent comprises heating the paste at a temperature within a range of 25° C. to 200° C.

8. The method of claim 1, wherein applying the paste comprises applying a paste comprising one of Au, Ag, and Cu grains.

9. The method of claim 1, wherein applying the paste comprises applying a paste comprising a metal grain distribution where at least 50% of the grains are smaller than 50 nm.

10. The method of claim 1, wherein applying the paste comprises applying a paste comprising a sintering inhibitor comprising a technical wax.

11. A method for fabricating a module, the method comprising:
    applying a paste comprising metal grains, a solvent, and a sintering inhibitor to a semiconductor chip;
    drying the paste to evaporate the solvent;
    heating a substrate comprising a metal surface in a non-oxidizing atmosphere;

placing the semiconductor chip on the heated metal surface such that the paste contacts the heated metal surface; and applying a force to the semiconductor chip to form a sintered joint joining the semiconductor chip to the metal surface.

12. The method of claim 11, wherein drying the paste comprises heating the paste at a temperature within a range 25° C. to 200° C. in a vacuum.

13. The method of claim 11, wherein heating the substrate comprises heating the substrate at a temperature within a range 150° C. to 400° C.

14. The method of claim 11, wherein applying the force comprises applying a force within a range of 1 MPa to 10 MPa.

15. The method of claim 11, wherein applying the force comprises applying the force for a time within a range of 50 ms to 6000 ms.

16. The method of claim 11, wherein applying the paste comprises one of printing the paste and dispensing the paste.

17. The method of claim 11, wherein applying the paste comprises applying a paste comprising one of Au, Ag, and Cu grains.

18. The method of claim 11, wherein applying the paste comprises applying a paste comprising a metal grain distribution where at least 95% of the grains are smaller than 50 nm.

19. The method of claim 11, wherein heating the substrate comprises heating the substrate in an indexing tunnel furnace.

* * * * *